United States Patent
Sim et al.

(10) Patent No.: US 11,503,749 B2
(45) Date of Patent: Nov. 15, 2022

(54) DISPLAY INCLUDING SHIELDING MEMBER ARRANGED TO COVER AT LEAST PART OF DISPLAY DRIVING CIRCUIT, AND ELECTRONIC DEVICE INCLUDING SAME

(71) Applicant: Samsung Electronics Co., Ltd., Suwon-si (KR)

(72) Inventors: Hyunwoo Sim, Suwon-si (KR); Yonghwa Kim, Suwon-si (KR); Dongil Son, Suwon-si (KR); Seungbum Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/048,552

(22) PCT Filed: Apr. 18, 2019

(86) PCT No.: PCT/KR2019/004686
§ 371 (c)(1),
(2) Date: Oct. 16, 2020

(87) PCT Pub. No.: WO2019/203589
PCT Pub. Date: Oct. 24, 2019

(65) Prior Publication Data
US 2021/0168973 A1  Jun. 3, 2021

(30) Foreign Application Priority Data
Apr. 18, 2018  (KR) .................. 10-2018-0044808

(51) Int. Cl.
*H05K 9/00* (2006.01)
*H05K 1/18* (2006.01)
*H05K 5/00* (2006.01)

(52) U.S. Cl.
CPC ............ *H05K 9/0054* (2013.01); *H05K 1/189* (2013.01); *H05K 5/0017* (2013.01); *H05K 2201/10128* (2013.01); *H05K 2201/10371* (2013.01)

(58) Field of Classification Search
CPC .................................................... H05K 9/0054
(Continued)

(56) References Cited

U.S. PATENT DOCUMENTS

2010/0177498 A1  7/2010  Choi et al.
2013/0242215 A1  9/2013  Chang
(Continued)

FOREIGN PATENT DOCUMENTS

JP  2004-029448 A  1/2004
JP  2014-170036 A  9/2014
(Continued)

OTHER PUBLICATIONS

International Search Report and Written Opinion of the International Searching Authority in connection with International Application No. PCT/KR2019/004686 dated Jul. 31, 2019, 10 pages.
Korean Intellectual Property Office, "Notice of Preliminary Rejection," dated Aug. 24, 2022, in connection with Korean Patent Application No. 10-2018-0044808, 15 pages.

*Primary Examiner* — Stanley Tso

(57) ABSTRACT

According to various embodiments, an electronic device may include a housing, and a display disposed to at least part of the housing. The display may include a display panel including at least one pixel, and a substrate layer disposed below the display panel. The substrate layer may include a bendable connecting area extending to the outside of the display panel. The display may further include a display driving circuit disposed to one face of the connecting area, a Flexible Printed Circuit Board (FPCB) electrically coupled with at least part of the connecting area and including a contact area to which a conductor electrically coupled with
(Continued)

a ground portion of the electronic device is exposed, and a shielding member electrically coupled with the contact area. The shielding member may be disposed on the FPCB and one face of the connecting area to cover at least part of the display driving circuit. Various other embodiments may also be possible.

15 Claims, 17 Drawing Sheets

(58) Field of Classification Search
USPC .......................................................... 361/749
See application file for complete search history.

(56) References Cited

U.S. PATENT DOCUMENTS

| 2014/0042406 | A1* | 2/2014 | Degner | ................... | H05K 1/028 |
| | | | | | 257/40 |
| 2021/0105890 | A1* | 4/2021 | Powney | ................. | H05K 3/005 |

FOREIGN PATENT DOCUMENTS

| KR | 10-2010-0082640 A | 7/2010 |
| KR | 10-2013-0106088 A | 9/2013 |
| KR | 10-2016-0150640 A | 12/2016 |
| KR | 10-2017-0034040 A | 3/2017 |
| KR | 10-2017-0047791 A | 5/2017 |

\* cited by examiner

DISPLAY INCLUDING SHIELDING MEMBER ARRANGED TO COVER AT LEAST PART OF DISPLAY DRIVING CIRCUIT, AND ELECTRONIC DEVICE INCLUDING SAME

CROSS-REFERENCE TO RELATED APPLICATIONS

This application is a 371 National Stage of International Application No. PCT/KR2019/004686, filed Apr. 18, 2019, which claims priority to Korean Patent Application No. 10-2018-0044808, filed Apr. 18, 2018, the disclosures of which are herein incorporated by reference in their entirety.

BACKGROUND

1. Field

Various embodiments of the present disclosure relate to a display including a shielding member disposed to cover at least part of a display driving circuit, and an electronic device including the same.

2. Description of the Related Art

Portable electronic devices, in particular, electronic devices represented as smart phones, have been progressively developed and thus a hardware/software gap has been gradually reduced for each manufacturer. As a result, there is a tendency that the electronic device is improved not only in a performance aspect but also in feeling of use or in a design aspect. In particular, the portable electronic device is gradually adopting a large-screen touch display to facilitate manipulation and to secure visibility.

SUMMARY

While portable electronic devices are becoming slim for aesthetic design and portability improvement, there is a trend of adopting a large-screen touch display (hereinafter, a 'display') large enough to occupy most of a front face of an electronic device for manipulation convenience and visibility enhancement.

The display may include a connecting area (e.g., a wiring area) extending from some surrounding areas of a display area, and a driving circuit (e.g., a Display Driver IC (DDI), an LCD driver IC (LDI), and/or a Touch Driver IC (TDI)) may be mounted in the connecting area. The driving circuit may output an image through a display panel or may process a signal input from a touch panel. The driving circuit may be disposed close to surrounding electronic components according to a recent trend depending on extension of the display, and noise such as Electromagnetic Interface (EMI) noise generated from the driving circuit may cause a performance deterioration of the surrounding electronic components. For example, when the driving circuit is close to a surrounding antenna, there may be a problem in that radiation performance of an antenna deteriorates due to the noise generated from the driving circuit.

According to various embodiments of the present disclosure, there may be provided a display including a shielding member disposed to cover at least part of a display driving circuit, and an electronic device including the display.

According to various embodiments, there may be provided a display including a shielding member disposed to cover at least part of a display driving circuit and capable of adopting a large-screen display while avoiding a performance deterioration of a surrounding electronic device, and an electronic device including the display.

According to various embodiments, an electronic device may include a housing, and a display disposed to at least part of the housing. The display may include a display panel including at least one pixel, and a substrate layer disposed below the display panel. The substrate layer may include a bendable connecting area extending to the outside of the display panel. The display may further include a display driving circuit disposed to one face of the connecting area, a Flexible Printed Circuit Board (FPCB) electrically coupled with at least part of the connecting area and including a contact area to which a conductor electrically coupled with a ground portion of the electronic device is exposed, and a shielding member electrically coupled with the contact area. The shielding member may be disposed on the FPCB and one face of the connecting area to cover at least part of the display driving circuit.

According to various embodiments, a display device may include a display panel including at least one pixel and a substrate layer disposed below the display panel. The substrate layer may include a bendable connecting area extending to the outside of the display panel. The display may further include a driving circuit disposed to one face of the connecting area, an FPCB electrically coupled with at least part of the connecting area and including a contact area to which a conductor electrically coupled with a ground portion of the display device is exposed, and a shielding member electrically coupled with the contact area. The shielding member may be disposed on the FPCB and one face of the connecting area to cover at least part of the display driving circuit.

According to various embodiments, a display device may include a display panel including at least one pixel, a substrate layer disposed below the display panel, a bendable connecting area electrically coupled with the substrate layer, a display driving circuit disposed to one face of the connecting area, an FPCB including a contact area to which a conductor electrically coupled with a ground portion of the display device is exposed, and a shielding member electrically coupled with the contact area. The shielding member may be disposed on the FPCB and one face of the connecting area to cover at least part of the display driving circuit.

According to various embodiments, a shielding member capable of shielding noise generated from a display driving circuit is applied, thereby providing an electronic device adopting a large-screen display capable of avoiding a performance deterioration of a surrounding electronic component.

DETAILED DESCRIPTION

Figure 1:
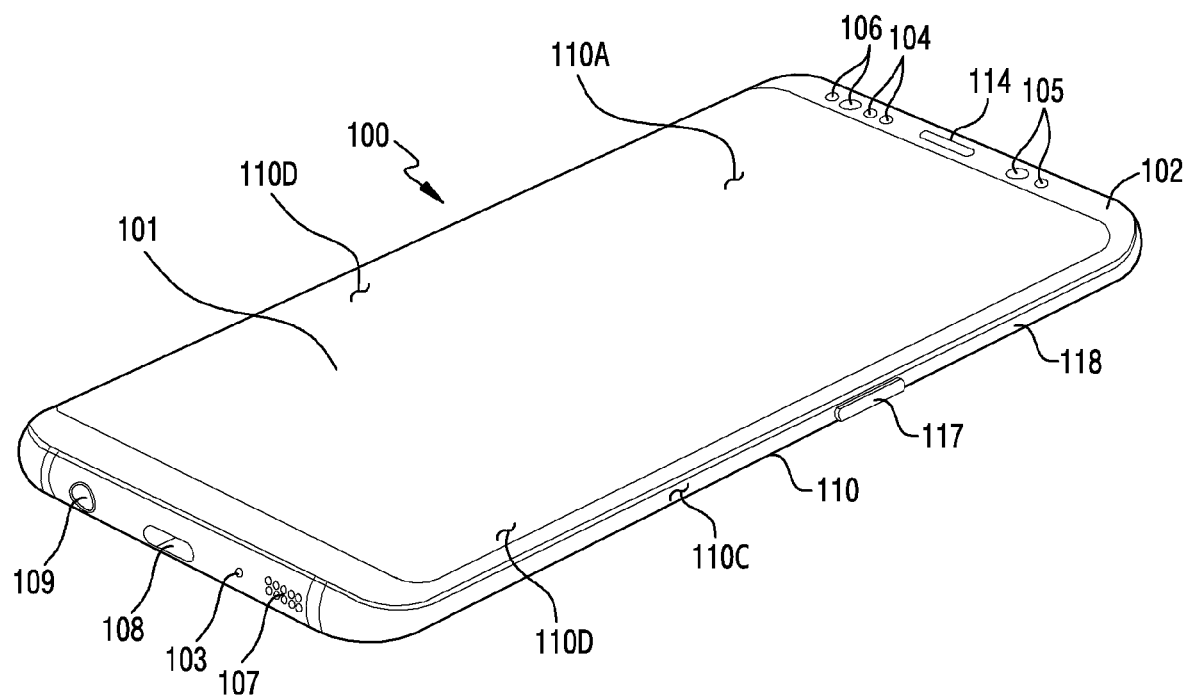
FIG. 1 is a front perspective view of a mobile electronic device according to various embodiments of the present disclosure.
Figure 2:
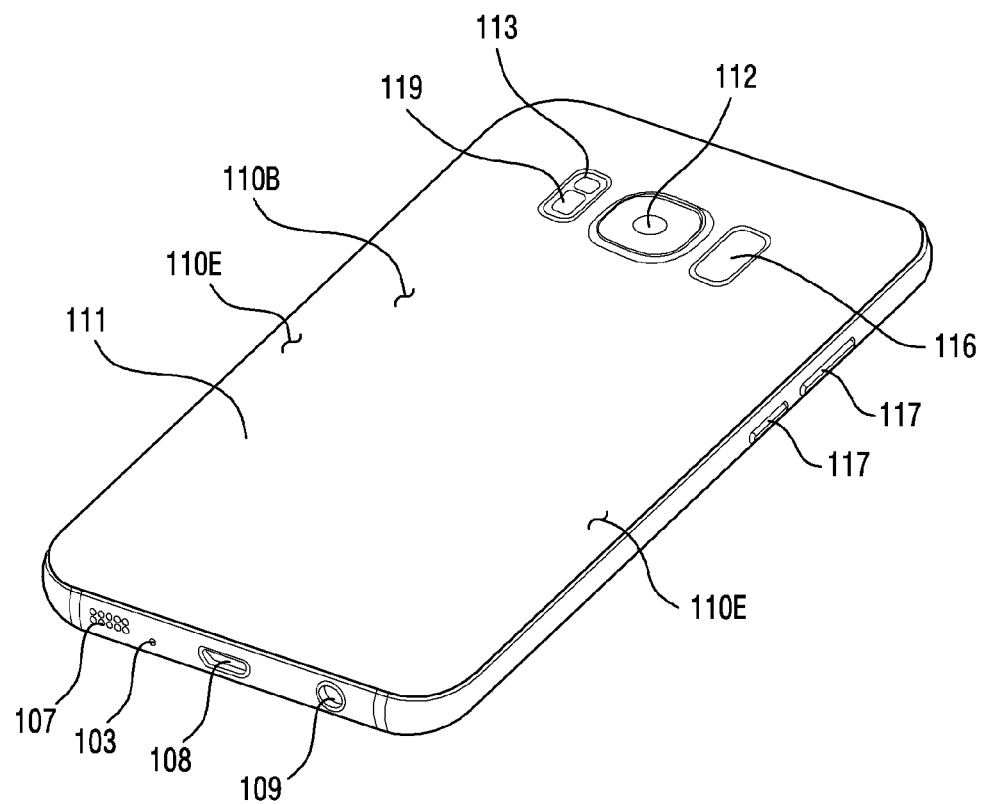
FIG. 2 is a rear perspective view of the electronic device of FIG. 1 according to various embodiments of the present disclosure.

FIG. 1 is a front perspective view of a mobile electronic device according to various embodiments of the present disclosure. FIG. 2 is a rear perspective view of the electronic device of FIG. 1 according to various embodiments of the present disclosure.

Referring to FIGS. 1 and 2, the electronic device 100 according to an embodiment may include a housing 110 including a first face (or a front face) 110A, a second face (or a rear face) 110B, and a side face 110C surrounding the space between the first face 110A and the second face 110B. In another embodiment (not illustrated), the term "housing" may refer to a structure forming some of the first face 110A, the second face 110B, and the side face 110C of FIG. 1. According to an embodiment, at least a portion of the first face 110A may be formed of a substantially transparent front plate 102 (e.g., a glass plate or a polymer plate including various coating layers). The second face 110B may be formed by a substantially opaque rear plate 111. The rear plate 111 may be formed of, for example, coated or colored glass, ceramic, polymer, or metal (e.g., aluminum, stainless steel (STS), or magnesium), or a combination of two or more of these materials. The side face 110C may be formed by a side bezel structure 118 (or a "side member") coupled to the front plate 102 and the rear plate 111 and including a metal and/or a polymer. In some embodiments, the rear plate 111 and the side bezel structure 118 may be integrally formed, and may include the same material (e.g., a metal material such as aluminum).

In the illustrated embodiment, the front plate 102 may include, at the long opposite side edges thereof, two first areas 110D, which are bent from the first face 110A towards the rear plate 111 and extend seamlessly. In the illustrated embodiment (see FIG. 2), the rear plate 111 may include, at the long opposite side edges thereof, two second areas 110E, which are bent from the second face 110B towards the front plate 102 and extend seamlessly. In some embodiments, the front plate 102 (or the rear plate 111) may include only one of the first areas 110D (or the second areas 110E). In another embodiment, some of the first areas 110D and the second areas 110E may not be included. In the embodiments described above, when viewed from a side of the electronic device 100, the side bezel structure 118 may have a first thickness (or width) on the side faces, which do not include the first areas 110D or the second areas 110E, and may have a second thickness (or width), which is smaller than the first thickness, on the side faces, which include the first areas 110D or the second areas 110E.

According to an embodiment, the electronic device 100 may include at least one of a display 101, audio modules 103, 107, and 114, sensor modules 104, 116, and 119, camera modules 105, 112, and 113, key input devices 117, light-emitting elements 106, and connector holes 108 and 109. In some embodiments, at least one of the components (e.g., the key input devices 117 or the light-emitting elements 106) may be omitted from the electronic device 100, or the electronic device 100 may additionally include other components According to an embodiment, the display 101 may be exposed through a large portion of, for example, the front plate 102. In some embodiments, at least a portion of the display 101 may be exposed through the front plate 102 forming the first face 110A and the first areas 110D of the side faces 110C. In some embodiments, the edges of the display 101 may be formed to be substantially the same as the shape of the periphery of the front plate 102 adjacent thereto. In another embodiment (not illustrated), the distance between the periphery of the display 101 and the periphery of the front plate 102 may be substantially constant in order to enlarge the exposed area of the display 101.

In another embodiment (not illustrated), a recess or an opening may be formed in a portion of the screen display area of the display 101, and at least one of the audio module 114, the sensor module 104, the camera module 105, and the light-emitting elements 106 may be aligned with the recess or the opening. In another embodiment (not illustrated), the rear face of the screen display area of the display 101 may include at least one of the audio module 114, the sensor module 104, the camera module 105, the fingerprint sensor 116, and the light-emitting elements 106. In another embodiment (not illustrated), the display 101 may be coupled to or disposed adjacent to a touch-sensitive circuit, a pressure sensor that is capable of measuring a touch intensity (pressure), and/or a digitizer that detects a magnetic-field-type stylus pen. In some embodiments, at least some of the sensor modules 104 and 119 and/or at least some of the key input devices 117 may be disposed in the first areas 110D and/or the second areas 110E.

According to an embodiment, the audio modules 103, 107, and 114 may include a microphone hole 103 and speaker holes 107 and 114. The microphone hole 103 may include a microphone disposed therein so as to acquire external sound, and in some embodiments, multiple micro phones may be disposed therein so as to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker may be included without the speaker holes 107 and 114 (e.g., a piezo speaker).

According to an embodiment, the sensor modules 104, 116, and 119 may generate an electrical signal or a data value corresponding to the internal operating state or the external environmental state of the electronic device 100. The sensor modules 104, 116, and 119 may include, for example, a first sensor module 104 (e.g., a proximity sensor), a second sensor module (not illustrated) (e.g., a fingerprint sensor) disposed on the first face 110A of the housing 110, a third sensor module 119 (e.g., an HRM sensor), and/or a fourth sensor module 116 (e.g., a fingerprint sensor) disposed on the second face 110B of the housing 110. The fingerprint sensor may be disposed not only on the first face 110A of the housing 110 (e.g., the display 101), but also on the second face 110B. The electronic device 100 may further include at least one of sensor modules (not illustrated) such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

According to an embodiment, the camera modules 105, 112, and 113 may include, for example, a first camera device 105 disposed on the first face 110A of the electronic device 100 and a second camera device 112 and/or a flash 113 disposed on the second face 110B of the electronic device 100. The camera modules 105 and 112 may include one or more lenses, an image sensor, and/or an image signal processor. The flash 113 may include, for example, a light emitting diode or a xenon lamp. In some embodiments, two or more lenses (e.g., an infrared camera lens, a wide-angle lens, and a telephoto lens) and image sensors may be disposed on one face of the electronic device 100.

According to an embodiment, the key input devices 117 may be disposed on the side face 110C of the housing 110. In another embodiment, the electronic device 100 may not include some or all of the above-mentioned key input devices 117, and a key input device 117, which is not included in the electronic device 100, may be implemented in another form, such as that of a soft key or the like, on the display 101. In some embodiments, the key input devices 117 may include a sensor module 116 disposed on the second face 110B of the housing 110.

According to an embodiment, the light-emitting element 106 may be disposed on, for example, the first face 110A of the housing 110. The light-emitting element 106 may provide, for example, information about the state of the electronic device 100 in an optical form. In another embodiment, the light-emitting element 106 may provide a light source that is interlocked with, for example, the operation of the camera module 105. The light-emitting element 106 may include, for example, an LED, an IR LED, and a xenon lamp.

The connector holes 108 and 109 may include a first connector hole 108 that is capable of accommodating a connector (e.g., a USB connector) for transmitting and receiving power and/or data to and from an external electronic device, and/or a second connector hole 109 that is capable of receiving a connector (e.g., an earphone jack) for transmitting and receiving an audio signal to and from an electronic device.

Figure 3A:
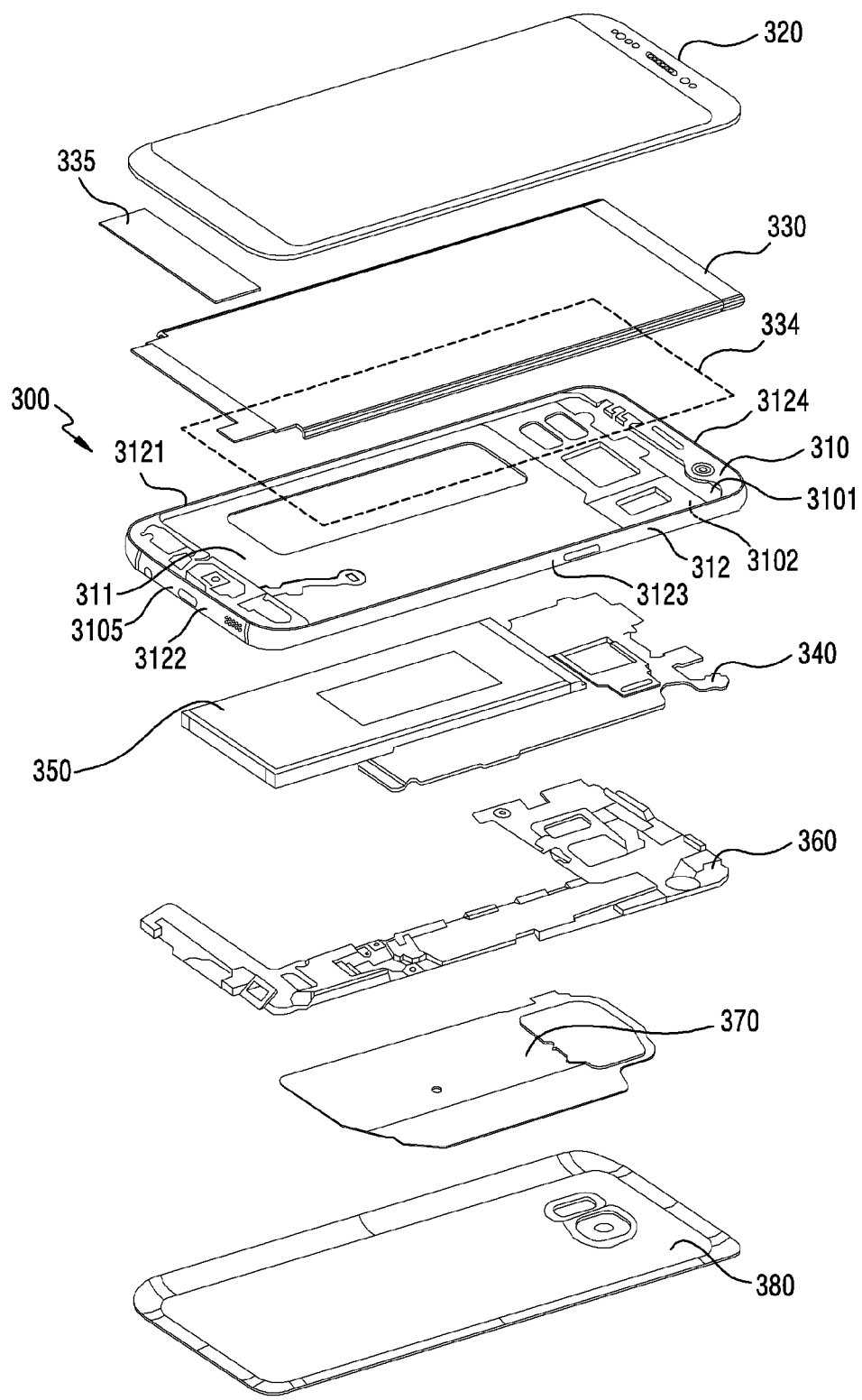
FIG. 3A is an exploded perspective view of the electronic device of FIG. 1 according to various embodiments of the present disclosure.

FIG. 3A is an exploded perspective view of the electronic device of FIG. 1 according to various embodiments of the present disclosure.

Referring to FIG. 3A, an electronic device 300 (e.g., the electronic device 100 in FIGS. 1 and 2) may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In some embodiments, at least one of the components (e.g., the first support member 311 or the second support member 360) may be omitted from the electronic device 300, or the electronic device 300 may additionally include other components. At least one of the components of the electronic device 300 may be the same as or similar to at least one of the components of the electronic device 100 of FIG. 1 or 2, and a redundant description thereof is omitted below.

According to an embodiment, the first support member 311 may be disposed inside the electronic device 300 so as to be connected to the side bezel structure 310, or the first support member 311 may be integrally formed with the side bezel structure 310. The first support member 311 may be formed of, for example, a metal material and/or a non-metal material (e.g., a polymer). The display 330 may be coupled to one face of the first support member 311, and the printed circuit board 340 may be coupled to the other face of the first support member 311. On the printed circuit board 340, a processor, memory, and/or an interface may be mounted. The processor may include at least one of, for example, a central processing unit (CPU), an application processor, a graphics processor, an image signal processor, a sensor hub processor, or a communication processor.

According to an embodiment, the memory may include, for example, volatile memory or nonvolatile memory.

According to an embodiment, the interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/an MMC connector, or an audio connector.

According to an embodiment, the battery 350 is a device for supplying power to at least one component of the electronic device 300, and may include, for example, a non-rechargeable primary battery, a rechargeable secondary battery, or a fuel cell. At least a portion of the battery 350 may be disposed on substantially the same plane as, for example, the printed circuit board 340. The battery 350 may be integrally disposed within the electronic device 300, or may be detachably mounted on the electronic device 300.

According to an embodiment, the antenna 370 may be disposed between the rear plate 380 and the battery 350. The antenna 370 may include, for example, a nearfield communication (NFC) antenna, a wireless charging antenna, and/or a magnetic secure transmission (MST) antenna. The antenna 370 may perform short-range communication with, for example, an external electronic device, or may transmit/receive power required for charging to/from the external device in a wireless manner. In another embodiment, an antenna structure may be formed by the side bezel structure 310, a portion of the first support member 311, or a combination thereof.

According to various embodiments, at least one sub-material layer 334 may be disposed between the display 330 and the side bezel structure 310. According to an embodiment, the sub-material layer 334 may include a polymer member, a functional member, or a conductive member. According to an embodiment, the polymer member may be attached to a rear face of the display 330 by using an adhesive member (e.g., an Optically Clear Adhesive (OCA), a Pressure Sensitive Adhesive (PSA), a general adhesive, a tape, or a bonding and thermally reactive adhesive), and may perform a buffering function. According to an embodiment, the polymer member may be applied with dark color (e.g., black) to assist implementation of a background when a display is off. According to an embodiment, the functional member may include an added display, a force touch Flexible Printed Circuit Board (FPCB), a fingerprint sensor FPCB, an antenna radiator for communication, a heat dissipation sheet, a conductive/non-conductive tape, an open cell sponge, or a graphite sheet for heat dissipation. According to an embodiment, the conductive member may include a metal member for shielding noise and for dissipating heat emitted from surrounding heat-emitting components. According to an embodiment, the metal member may include copper (Cu).

According to various embodiments, at least part of the side bezel structure 310 may be constructed of a conductive material. According to an embodiment, the side bezel structure 310 may include a first face 3101 facing a first direction (e.g., a display direction), a second face 3102 facing away from the first face 3101, and a side face 312 surrounding a space between the first face 3101 and the second face 3102. According to an embodiment, at least part of the side face 312 may be disposed to be exposed to the outside along a periphery of the electronic device 320. According to an embodiment, the side face 312 may include a first side face 3121 having a first length, a second side face 3121 vertically extending from the first side face 3121 and having a second length, a third side face 3123 extending from the second side face 3122 to have the first length in a direction parallel to the first side face 3121, and a fourth side face 3124 extending from the third side face 3123 to have the second length in a direction parallel to the second side face 3122. According to an embodiment, at least some areas of the second side face 3122 may be constructed as a unit bezel 3105 divided by a non-conductive area. According to an embodiment, the unit bezel 3105 may be electrically coupled with a wireless communication circuit mounted on a Printed Circuit Board (PCB) 340 to serve as an antenna.

According to various embodiments, the display 330 may include a driving circuit (e.g., the driving circuit 3322 of FIG. 4) (e.g., a DDI, an LDI, and/or a TDI). According to an embodiment, the driving circuit may be disposed in the vicinity of the unit bezel 3105 serving as an antenna. Therefore, the electronic device 300 may include a shielding member 335 disposed to cover at least part of the driving circuit which is a cause of noise generation of the display. According to an embodiment, the shielding member 335 may be disposed to cover the entirety of the driving circuit or to cover up to at least part of a surrounding area thereof as well as the driving circuit. According to an embodiment, the shielding member 335 may include a conductive thin-film tape, a thin metal plate (e.g., a Cu plate), or a conductive paint (e.g., an EMI paint).

Figure 3B:
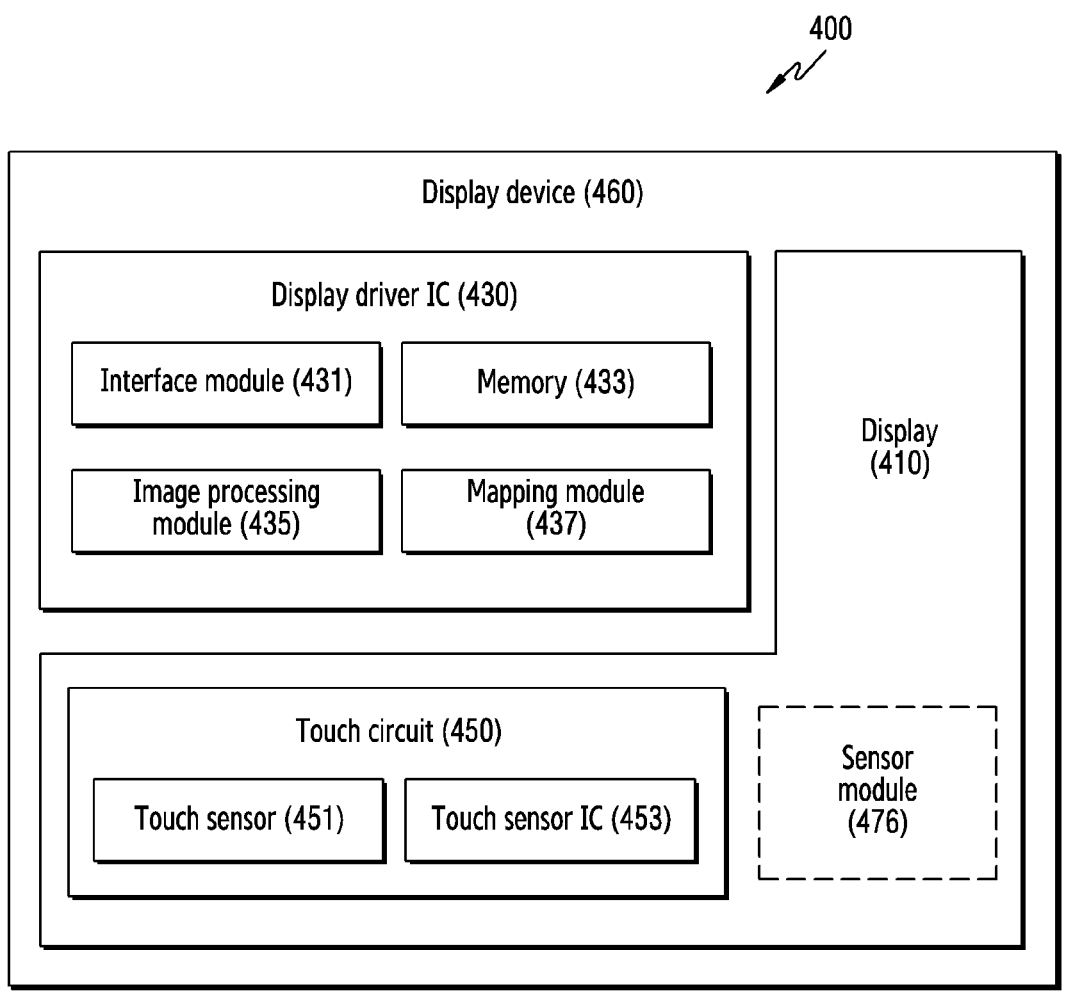
FIG. 3B is a block diagram of a display device according to various embodiments of the present disclosure.

FIG. 3B is a block diagram of a display device according to various embodiments of the present disclosure.

Referring to FIG. 3B, the display device 460 may include a display 410 and a display driver integrated circuit (DDI) 430 to control the display 410. The DDI 430 may include an interface module 431, memory 433 (e.g., buffer memory), an image processing module 435, or a mapping module 437. The DDI 430 may receive image information that contains image data or an image control signal corresponding to a command to control the image data from another component of the electronic device 400 via the interface module 431. For example, according to an embodiment, the image information may be received from the processor (e.g., the main processor (e.g., an application processor)) or the auxiliary processor (e.g., a graphics processing unit) operated independently from the function of the main processor. The DDI 430 may communicate, for example, with touch circuitry 450 or the sensor module 476 via the interface module 431. The DDI 430 may also store at least part of the received image information in the memory 433, for example, on a frame by frame basis. The image processing module 435 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 410. The mapping module 437 may generate a voltage value or a current value corresponding to the image data pre-processed or post-processed by the image processing module 435. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 410 may be driven, for example, based at least in part on the voltage value or the current value such that visual information (e.g., a text, an image, or an icon) corresponding to the image data may be displayed via the display 410.

According to an embodiment, the display device 460 may further include the touch circuitry 450. The touch circuitry 450 may include a touch sensor 451 and a touch sensor IC 453 to control the touch sensor 451. The touch sensor IC 453 may control the touch sensor 451 to sense a touch input or a hovering input with respect to a certain position on the display 410. To achieve this, for example, the touch sensor 451 may detect (e.g., measure) a change in a signal (e.g., a voltage, a quantity of light, a resistance, or a quantity of one or more electric charges) corresponding to the certain position on the display 410. The touch circuitry 450 may provide input information (e.g., a position, an area, a pressure, or a time) indicative of the touch input or the hovering input detected via the touch sensor 451 to the processor. According to an embodiment, at least part (e.g., the touch sensor IC 453) of the touch circuitry 450 may be formed as part of the display 410 or the DDI 430, or as part of another component (e.g., the auxiliary processor) disposed outside the display device 460.

According to an embodiment, the display device 460 may further include at least one sensor (e.g., a fingerprint sensor, an iris sensor, a pressure sensor, or an illuminance sensor) of the sensor module 476 or a control circuit for the at least one sensor. In such a case, the at least one sensor or the control circuit for the at least one sensor may be embedded in one portion of a component (e.g., the display 410, the DDI 430, or the touch circuitry 450)) of the display device 460. For example, when the sensor module 476 embedded in the display device 460 includes a biometric sensor (e.g., a fingerprint sensor), the biometric sensor may obtain biometric information (e.g., a fingerprint image) corresponding to a touch input received via a portion of the display 410. As another example, when the sensor module 476 embedded in the display device 460 includes a pressure sensor, the pressure sensor may obtain pressure information corresponding to a touch input received via a partial or whole area of the display 410. According to an embodiment, the touch sensor 451 or the sensor module 476 may be disposed between pixels in a pixel layer of the display 410, or over or under the pixel layer.

According to an embodiment, noise may be generated when the display driver IC 430 is driven, and the generated noise may have affect to a surrounding electronic component (e.g., an antenna radiator) of the electronic device. Therefore, according to exemplary embodiments of the present disclosure, a performance deterioration of the surrounding electronic component can be avoided by applying the shielding member (e.g., the shielding member 335 of FIG. 3A) for shielding the noise generated from the display driver IC 430.

Figure 4:
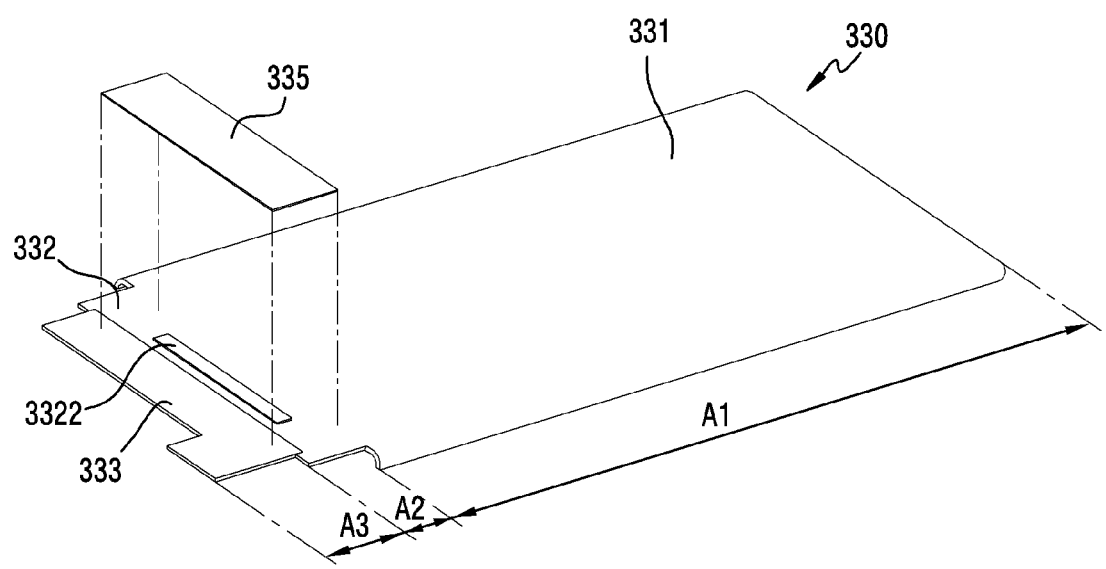
FIG. 4 is a perspective view of a display according to various embodiments of the present disclosure.

FIG. 4 is a perspective view of a display according to various embodiments of the present disclosure.

A display 330 of FIG. 4 may be at least in part similar to the display 101 of FIG. 1 or may include another embodiment of the display.

Referring to FIG. 4, the display 330 may include a display area (an area A1) corresponding to a display portion 331 for displaying an image, a connecting area (e.g., an area A2) (e.g., a Chip On Panel (COP) area) corresponding to a connecting portion 332 extending from the display portion 331, and an FPCB arrangement area (an area A3) corresponding to an FPCB 333 electrically coupled with at least part of the connecting portion 332. According to an embodiment, the connecting area (e.g., the area A2) may include a connecting area (e.g., a Chip On FPCB (COF) area) extending from the FPCB 333 other than the display portion 331. According to an embodiment, the connecting portion 331 may include a wiring area. Herein, a substrate layer (e.g., a substrate layer 3301 of FIG. 5B) extends from the wiring area, and a display panel (e.g., a display panel 3302 of FIG. 5B) including at least one pixel is mounted on the substrate layer. According to an embodiment, the display 330 may include a driving circuit 3322 mounted in at least some areas of the connecting portion 332. According to an embodiment, the driving circuit 3322 may include a DDI. According to an embodiment, when the display 330 includes a touch display, the driving circuit 3322 may include a TDI. According to an embodiment, one end of the FPCB 333 may be electrically coupled with the wiring area of the connecting portion 332, and when the display 330 is placed on the electronic device (e.g., the electronic device 300 of FIG. 3A), the other end thereof may be electrically coupled with a PCB (e.g., the PCB 340 of FIG. 3A).

According to various embodiments, the display 330 may include a shielding member 335 disposed to cover the driving circuit 3322 in at least some areas of the connecting portion 332. According to an embodiment, the shielding member 335 may be disposed to have a size capable of covering at least part of the driving circuit 3322, the entirety of the driving circuit 3322, or up to at least some areas of the connecting portion 332 as well as the driving circuit. Therefore, noise generated from the driving circuit 3322 may be shielded by the shielding member 335, thereby avoiding a performance deterioration of a surrounding electronic component.

Figure 5A:
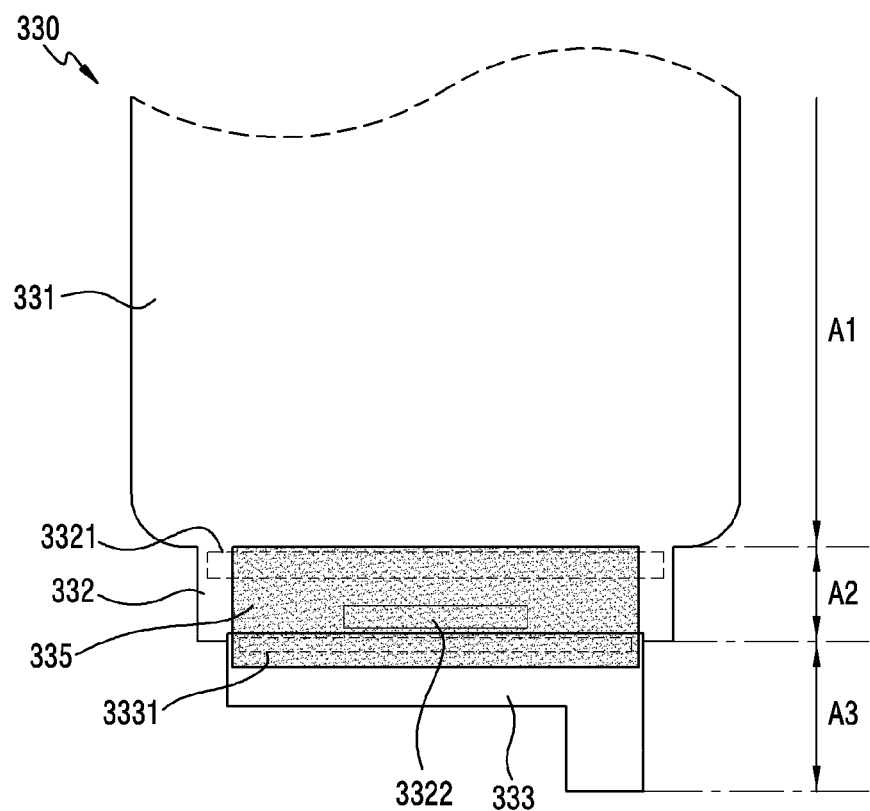
FIG. 5A is a partial plan view of a display to which a shielding member is applied according to various embodiments of the present disclosure.
Figure 5B:
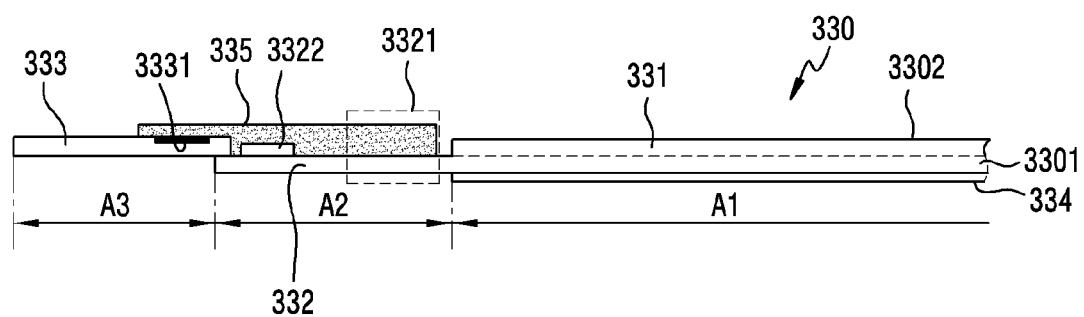
FIG. 5B is a cross-sectional view of a display of FIG. 5A according to various embodiments of the present disclosure.

FIG. 5A is a partial plan view of a display 330 to which a shielding member 335 is applied according to various embodiments of the present disclosure. FIG. 5B is a cross-sectional view of the display 330 of FIG. 5A according to various embodiments of the present disclosure.

Referring to FIG. 5A and FIG. 5B, the display 330 may include a display area (an area A1) corresponding to a display portion 331, a connecting area (an area A2) corresponding to a connecting portion 332 extending from the display portion 331, and an FPCB arrangement area (an area A3) corresponding to a FPCB 333 electrically coupled with at least part of the connecting portion 332. According to an embodiment, a driving circuit 3322 (e.g., a DDI or a TDI) may be disposed to at least part of the connecting portion 332.

According to various embodiments, the connecting portion 332 may include a bendable portion 3321 disposed such that at least part of the connecting portion 332, including the FPCB 333, is folded to a rear face of the display portion 331 to overlap with at least some areas of the display portion 331. According to an embodiment, the connecting portion 332 and the FPCB 333 may be folded to overlap with the display portion 331 by means of the bendable portion 3321.

According to various embodiments, the FPCB 333 attached to be electrically coupled with the connecting portion 332 may include a contact area 3331 disposed such that a conductor (e.g., a conductive pattern) is exposed in at least some areas. According to an embodiment, when the shielding member 335 is disposed to the connecting portion 332 to cover at least the driving circuit 3322, at least part of the shielding member 335 may be physically in contact and thus electrically coupled with the contact area 3331. Therefore, when the conductive shielding member 335 is applied to cover the driving circuit 3322 in the connecting portion 332 of the display 330, noise generated from the driving circuit 3322 may be shielded not to be radiated to a surrounding area by means of the shielding member 335 electrically coupled with the contact area 3331 and a ground of the FPCB 333 and a PCB (e.g., a PCB 340 of FIG. 5C) disposed inside the electronic device 330.

Figure 5C:
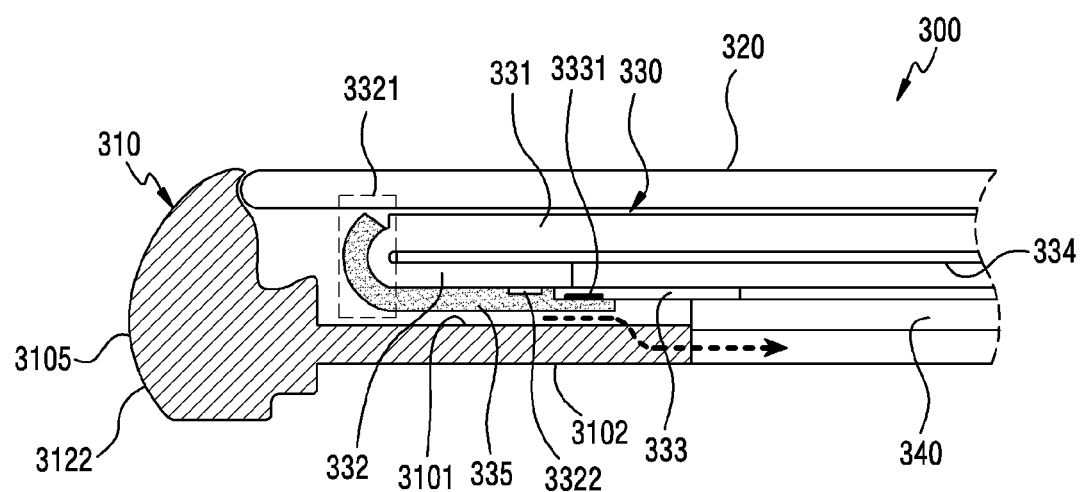
FIG. 5C is a cross-sectional view illustrating a main part of an electronic device to which a display of FIG. 5A is applied according to various embodiments of the present disclosure.

FIG. 5C is a cross-sectional view illustrating a main part of an electronic device 300 to which the display 330 of FIG. 5A is applied according to various embodiments of the present disclosure.

Referring to FIG. 5C, the electronic device 300 may include the display 330 disposed between a first face 3101 of a side bezel structure 310 and a front plate 320. According to an embodiment, the electronic device 300 may include a conductive member 334 disposed between the display 330 and the first face 3101 of the side bezel structure 310. According to an embodiment, the conductive member 334 is a metal plate or a metal tape, which may be disposed to be attached to a rear face of the display portion 331. According to an embodiment, the connecting portion 332 extending from the display portion 331 of the display 330 may be bent through the bendable portion 3321 and thus may be disposed to overlap with at least part of the conductive member 334 attached to the rear face of the display 330 together with the FPCB 333. According to an embodiment, the FPCB 333 disposed to one end of the bent connecting portion 331 may be electrically coupled with a PCB 340 disposed inside the electronic device 300, thereby forming a ground path illustrated in an arrow direction.

According to various embodiments, the shielding member 335 disposed to cover the driving circuit 3322 mounted on the connecting portion 332 may be disposed to extend to the bendable portion 3321 from the contact area 3331 including an exposed conductor of the FPCB 333. When a conductive unit bezel 3105 included in a second side face 3122 of the side bezel structure 310 disposed around the bendable portion 3321 serves as an antenna, noise generated from the driving circuit 3322 can be smoothly shielded by means of the shielding member 335 extending to the bendable portion 3321, and a deterioration of radiation performance of the antenna can be prevented.

According to various embodiments, additional conductive elements may be applied to the bendable portion 3321, instead of extending the shielding member 335. According to an embodiment, the conductive element may be applied as a component of the display 330, and may include conductive layers disposed to extend to the connecting portion 332. According to an embodiment, the conductive element may include a conductive paint (e.g., an EMI paint) coated on the bendable portion 3321. Therefore, the shielding member 335 disposed to cover the driving circuit 3322 may be electrically coupled with the contact area 3331 of the FPCB 333 and a ground of the FPCB 333 and the PCB 340 disposed inside the electronic device 300 to perform a shielding function.

Figure 6A:
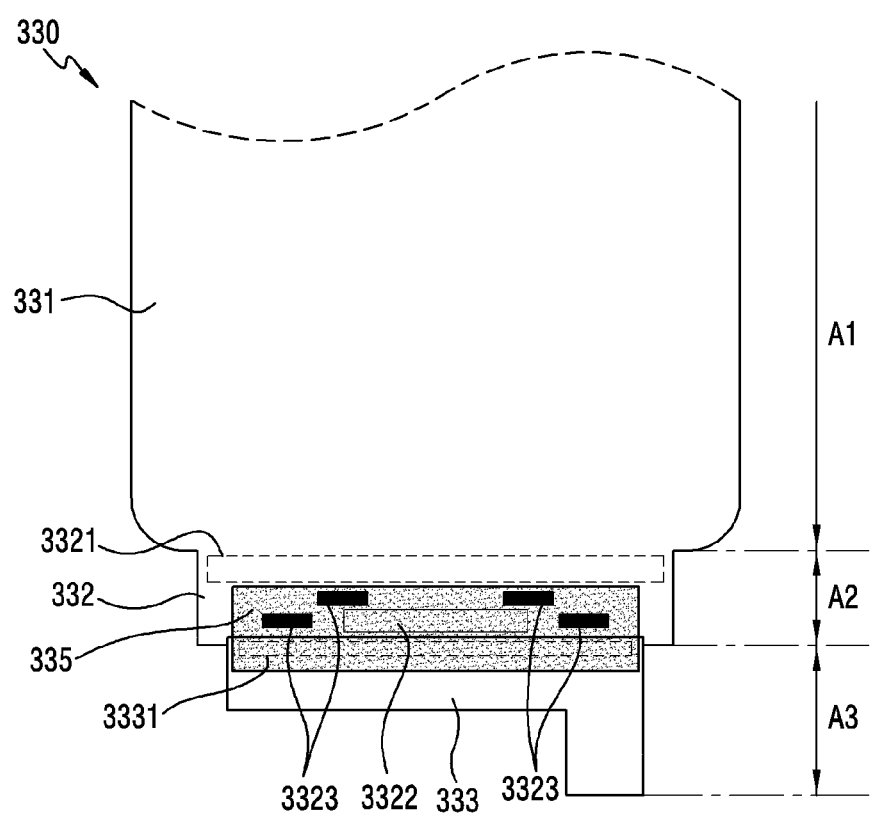
FIG. 6A is a partial plan view of a display to which a shielding member is applied according to various embodiments of the present disclosure.
Figure 6B:
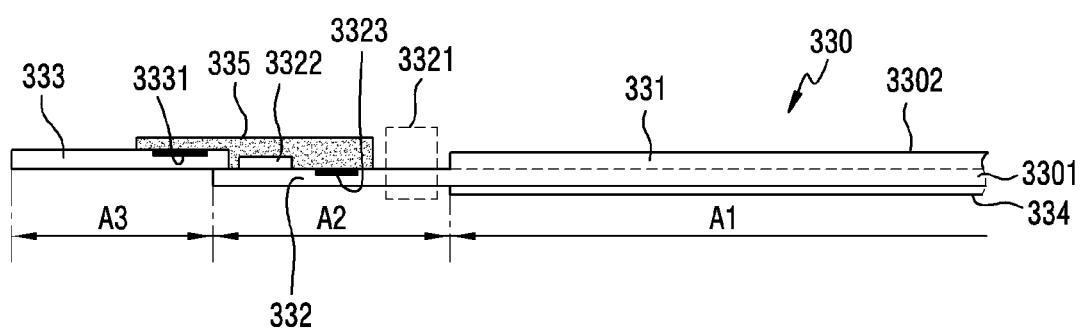
FIG. 6B is a cross-sectional view of a display of FIG. 6A according to various embodiments of the present disclosure.
Figure 6C:
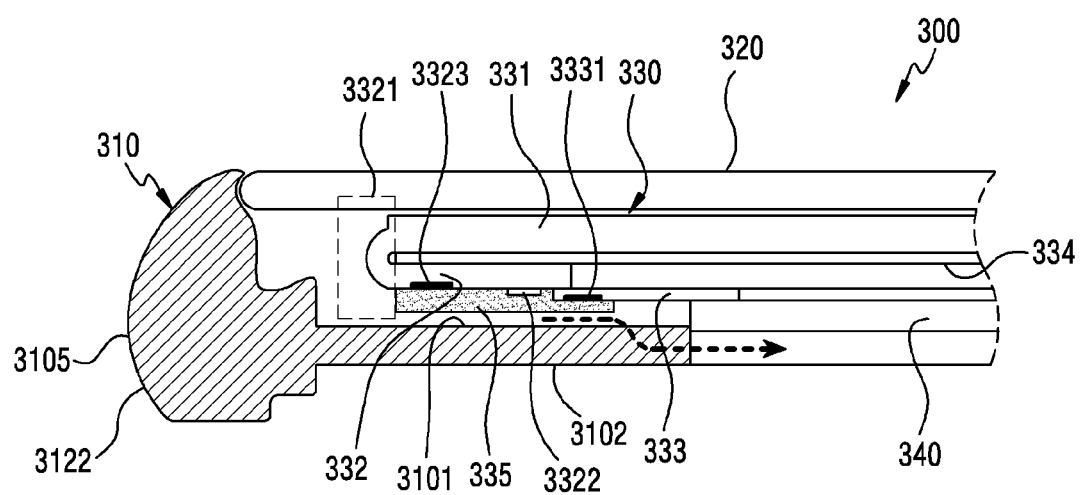
FIG. 6C is a cross-sectional view illustrating a main part of an electronic device to which a display of FIG. 6A is applied according to various embodiments of the present disclosure.

FIG. 6A is a partial plan view of a display 330 to which a shielding member 335 is applied according to various embodiments of the present disclosure. FIG. 6B is a cross-sectional view of the display 330 of FIG. 6A according to various embodiments of the present disclosure. FIG. 6C is a cross-sectional view illustrating a main part of an electronic device 300 to which the display 330 of FIG. 6A is applied according to various embodiments of the present disclosure.

Since the display structure of FIG. 6A to FIG. 6C and the arrangement structure of the electronic device 300 are the same as the structure of FIG. 5A to FIG. 5C, descriptions thereof may be omitted.

Referring to FIG. 6A to FIG. 6C, the display 330 may include at least one conductive contact 3323 disposed to at least some areas of a connecting portion 332 to enhance shielding by extending a ground area. According to an embodiment, the conductive contact 3323 may be constructed independently, or may be disposed to be electrically coupled with a conductive wiring disposed to the connecting portion 332. According to an embodiment, the conductive contact 3323 may be exposed to the outside through the connecting portion 332, and may be disposed to overlap with the shielding member 335 disposed to the connecting portion 332.

According to various embodiments, at least one conductive contact 3323 may be disposed to surround a driving circuit 3322 in the vicinity of the driving circuit 3322. Therefore, the driving circuit 3322 may be surrounded by the at least one conductive contact 3323 and a contact area 3331 disposed to an FPCB 333, and a more enhanced shielding effect may be applied through the shielding member 335 disposed to an upper portion thereof. Therefore, the shielding member 335 disposed to cover the driving circuit 3322 may be electrically coupled with at least one of the conductive contact 3323, the contact area 3331 of the FPCB 333, and a ground of the FPCB 333 and a PCB 340 disposed inside the electronic device 300, thereby forming a ground path in an illustrated arrow direction to perform a shielding function. According to an embodiment, although the shielding member 335 does not extend to a bendable portion 3321 of the connecting portion 332, as described above, it may extend to the bendable portion 3321 or an additional conductive element may be applied.

Figure 7A:
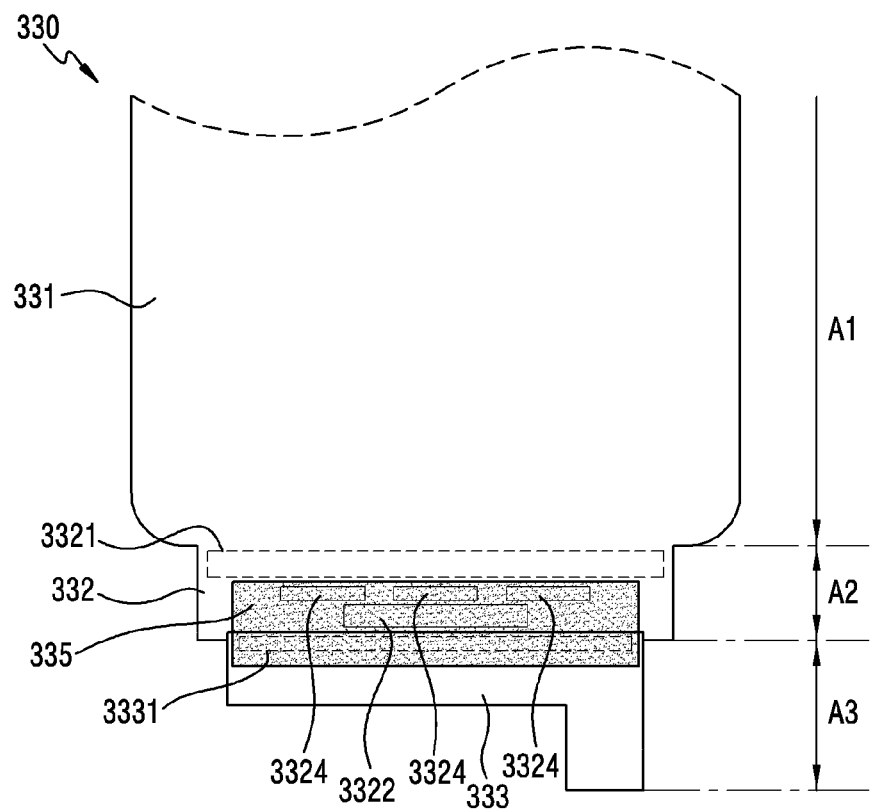
FIG. 7A is a partial plan view of a display to which a shielding member is applied according to various embodiments of the present disclosure.
Figure 7B:
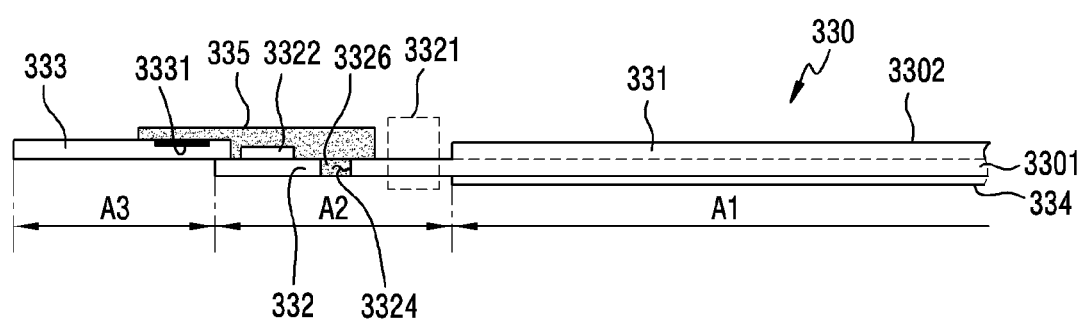
FIG. 7B is a cross-sectional view of a display of FIG. 7A according to various embodiments of the present disclosure.
Figure 7C:
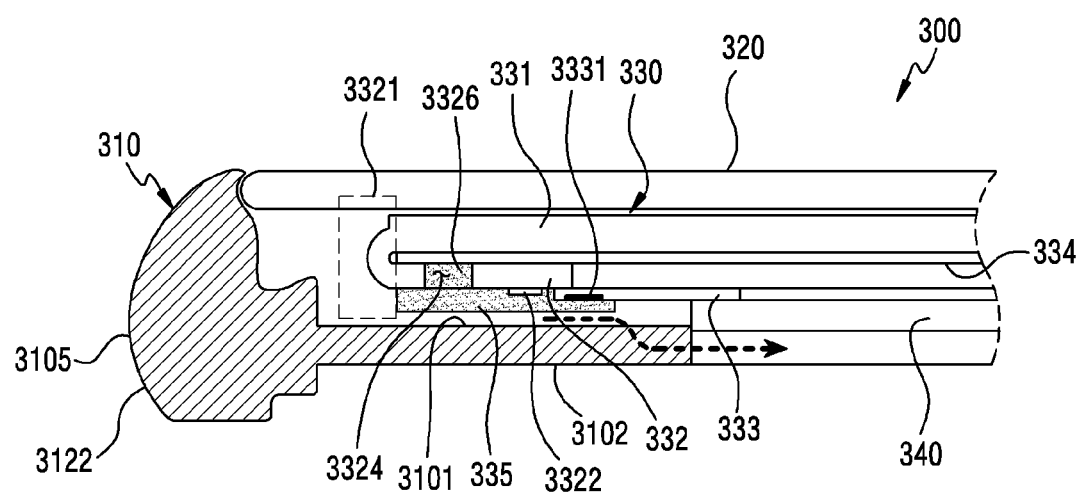
FIG. 7C is a cross-sectional view illustrating a main part of an electronic device to which a display of FIG. 7A is applied according to various embodiments of the present disclosure.

FIG. 7A is a partial plan view of a display 330 to which a shielding member 335 is applied according to various embodiments of the present disclosure. FIG. 7B is a cross-sectional view of the display 330 of FIG. 7A according to various embodiments of the present disclosure. FIG. 7C is a cross-sectional view illustrating a main part of an electronic device 300 to which the display 330 of FIG. 7A is applied according to various embodiments of the present disclosure.

Since the display structure of FIG. 7A to FIG. 7C and the arrangement structure of the electronic device are the same as the structure of FIG. 5A to FIG. 5C, descriptions thereof may be omitted.

Referring to FIG. 7A to FIG. 7C, the display 330 may include at least one opening 3324 disposed to at least some areas of a connecting portion 332 to enhance shielding by extending a ground area. According to an embodiment, the opening 3324 may be disposed at a position facing a contact area 3331 with a driving circuit 3322 interposed therebetween. According to an embodiment, the opening 3324 may be disposed to surround the driving circuit 3322 in the vicinity of the driving circuit 3322 together with the contact area 3331. According to an embodiment, the opening 3324 may be disposed to overlap with the shielding member 335 disposed to the connecting portion 332. According to an embodiment, the opening 3324 may be filled with a conductive material 3326. According to an embodiment, the conductive material 3326 may include a conductive tape.

According to various embodiments, when the connecting portion 332 and an FPCB 333 are folded to a rear face of a display portion 331 through a bendable portion 3321 in a state where the shielding member 335 is attached to the connecting portion 332, the connecting portion 332 may be disposed to overlap with a conductive member 334 disposed to the rear face of the display portion 331. In this case, at least some areas of the shielding member 335 may be disposed at a position that can be physically in contact or electrically coupled with the conductive member 334 by using the conductive material 3326 filled in the opening 3324. Therefore, the shielding member 335 disposed to cover the driving circuit 3322 may be electrically coupled with the conductive member 334, the contact area 3331 of the FPCB 333, and a ground of the FPCB 333 and a PCB 340 disposed inside the electronic device 300 by using the conductive material 3326 included in at least one opening 3324, thereby forming a ground path in an illustrated arrow direction to perform a shielding function. According to an embodiment, although the shielding member 335 does not extend to the bendable portion 3321 of the connecting portion 332, as described above, it may extend to the bendable portion 3321 or an additional conductive element may be applied.

Figure 8A:
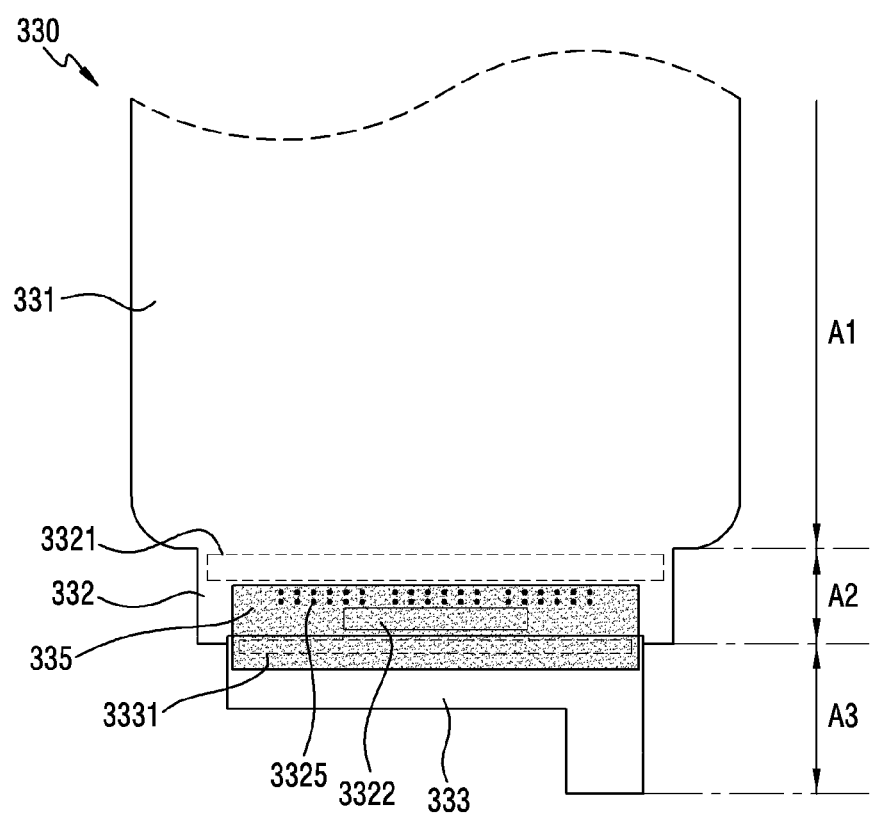
FIG. 8A is a partial plan view of a display to which a shielding member 335 is applied according to various embodiments of the present disclosure.
Figure 8B:
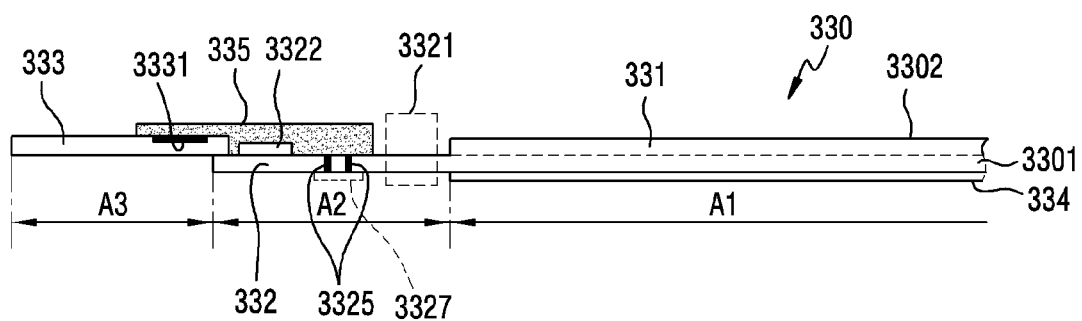
FIG. 8B is a cross-sectional view of a display of FIG. 8A according to various embodiments of the present disclosure.
Figure 8C:
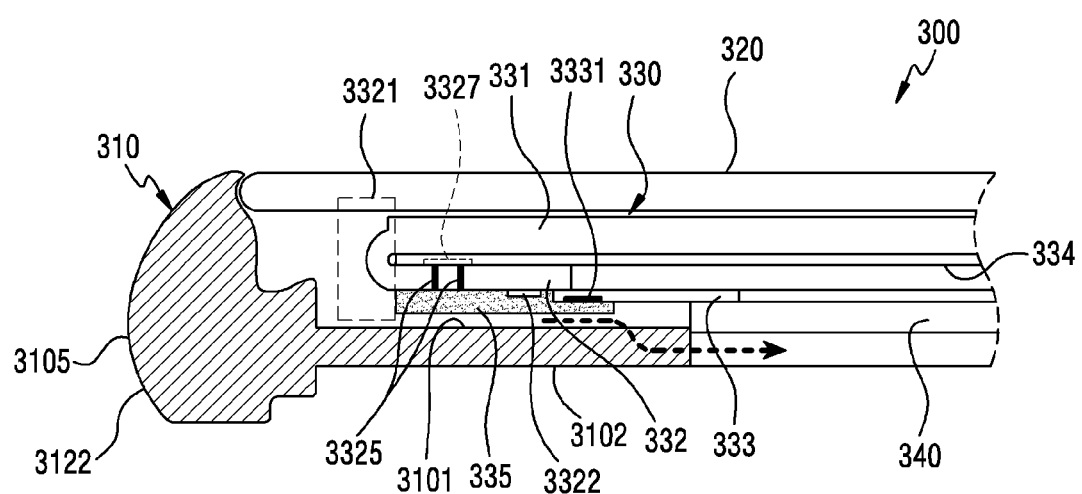
FIG. 8C is a cross-sectional view illustrating a main part of an electronic device to which a display of FIG. 8A is applied according to various embodiments of the present disclosure.

FIG. 8A is a partial plan view of a display 330 to which a shielding member 335 is applied according to various embodiments of the present disclosure. FIG. 8B is a cross-sectional view of the display 330 of FIG. 8A according to various embodiments of the present disclosure. FIG. 8C is a cross-sectional view illustrating a main part of an electronic device 300 to which the display 330 of FIG. 8A is applied according to various embodiments of the present disclosure.

Since the display structure of FIG. 8A to FIG. 8C and the arrangement structure of the electronic device are the same as the structure of FIG. 5A to FIG. 5C, descriptions thereof may be omitted.

Referring to FIG. 8A to FIG. 8C, the display 330 may include at least one conductive via 3325 disposed to at least some areas of a connecting portion 332 to enhance shielding by extending a ground area. According to an embodiment, the at least one conductive via 3325 may be disposed such that a conductive material is filled in a through-hole penetrating from one face of the connecting portion 332 to the other face opposite thereto. According to an embodiment, the at least one conductive via 3325 may be disposed at a position facing a contact area 3331 with a driving circuit 3322 interposed therebetween. According to an embodiment, the at least one conductive via 3325 may be disposed to surround the driving circuit 3322 in the vicinity of the driving circuit 3322 together with the contact area 3331. According to an embodiment, the at least one conductive via 3325 may be disposed to overlap with the shielding member 335 disposed to the connecting portion 332. According to an embodiment, the connecting portion 332 may include a conductive pad 3327 constructed to overlap with the at least one conductive via 3325 at a rear face thereof. According to an embodiment, when the connecting portion 332 is bent to overlap with a conductive member 334, the conductive pad 3327 may be attached by means of a conductive adhesive member or may be directly attached to the conductive member 334.

According to various embodiments, when the connecting portion 332 and an FPCB 333 are folded to a rear face of a display portion 331 through a bendable portion 3321 in a state where the shielding member 335 is attached to the connecting portion 332, the connecting portion 332 may be disposed to overlap with the conductive member 334 disposed to the rear face of the display portion 331. In this case, at least some areas of the shielding member 335 may be disposed at a position that can be physical in contact or electrically coupled with the conductive member 334 by using the conductive via 3325. Therefore, the shielding member 335 disposed to cover the driving circuit 3322 may be electrically coupled with the conductive member 334, the contact area 3331 of the FPCB 333, and a ground of the FPCB 333 and a PCB 340 disposed inside the electronic device 300 by using the at least one conductive via 3325, thereby forming a ground path in an illustrated arrow direction to perform a shielding function. According to an embodiment, although the shielding member 335 does not extend to the bendable portion 3321 of the connecting portion, as described above, it may extend to the bendable portion 3321 or an additional conductive element may be applied.

According to various embodiments, an electronic device (e.g., the electronic device 300 of FIG. 3A) may include a housing (e.g., the side bezel structure 310 of FIG. 3A) and a display (e.g., the display 330 of FIG. 5C) disposed to at least part of the housing. The display may include a display panel (e.g., the display panel 3302 of FIG. 5B) including at least one pixel and a substrate layer (e.g., the substrate layer 3301 of FIG. 5B) disposed below the display panel. The substrate layer may include a bendable connecting area (e.g., the connecting area (the area A2) of FIG. 5B) extending to the outside of the display panel. The display may further include a display driving circuit (e.g., the driving circuit 3322 of FIG. 5C) disposed to one face of the connecting area, a Flexible Printed Circuit Board (FPCB) (e.g., the FPCB 333 of FIG. 5C) electrically coupled with at least part of the connecting area and including a contact area (e.g., the contact area 3331 of FIG. 5C) to which a conductor electrically coupled with a ground portion of the electronic device is exposed, and a shielding member (e.g., the shielding member 335 of FIG. 5C) electrically coupled with the contact area. The shielding member may be disposed on the FPCB and one face of the connecting area to cover at least part of the display driving circuit.

According to various embodiments, the electronic device may include at least one conductive contact (e.g., the conductive contact 3323 of FIG. 6A) disposed around the driving circuit of the connecting area.

According to various embodiments, the conductive contact may be disposed to be exposed to an outer face of the connecting area so as to be coupled with the shielding member.

According to various embodiments, the conductive contact may be disposed to surround the driving circuit together with the contact area.

According to various embodiments, the electronic device may further include a conductive member (e.g., the conductive member 334 of FIG. 7C) disposed below the substrate layer. The connecting area may be disposed to overlap with at least part of the conductive member below the substrate layer in a state of being bent by the bendable portion (e.g., the bendable portion 3321 of FIG. 7C) constructed in at least part of the connecting area.

According to various embodiments, the electronic device may further include at least one opening (e.g., the opening 3324 of FIG. 7A) disposed around the driving circuit of the connecting area, and a conductive material (e.g., the conductive material 3326 of FIG. 7B) filled in the opening.

According to various embodiments, the opening may be disposed to surround the driving circuit together with the contact area.

According to various embodiments, the opening may be disposed at a position overlapping with the shielding member in the connecting area.

According to various embodiments, the shielding member may be disposed to be physically in contact or electrically coupled with the conductive member by using the conductive material filled in the opening.

According to various embodiments, the electronic device may further include at least one conductive via (e.g., the conductive via 3325 of FIG. 8A) disposed around the driving circuit of the connecting area.

According to various embodiments, the conductive via may be disposed to surround the driving circuit together with the contact area.

According to various embodiments, the conductive via may be disposed at a position overlapping with the shielding member in the connecting area.

According to various embodiments, the shielding member may be disposed to be physically in contact or electrically coupled with the conductive member by using the conductive via.

According to various embodiments, the connecting area may be disposed to overlap with at least part of the conductive member below the substrate layer in a state of being bent by the bendable portion constructed in at least part of the connecting area.

According to various embodiments, the shielding member may be constructed to have a size extending to the bendable portion from the contact area.

According to various embodiments, the shielding member may include a conductive thin-film tape, conductive plate, or conductive paint attached to the connecting area.

According to various embodiments, a display device (e.g., the display 330 of FIG. 5C) may include a display panel (e.g., the display panel 3302 of FIG. 5B) including at least one pixel and a substrate layer (e.g., the substrate layer 3301 of FIG. 5B) disposed below the display panel. The substrate layer may include a bendable connecting area (e.g., the connecting area (the area A2) of FIG. 5B) extending to the outside of the display panel. The display may further include a driving circuit (e.g., the driving circuit 3322 of FIG. 5C) disposed to one face of the connecting area, an FPCB (e.g., the FPCB 333 of FIG. 5C) electrically coupled with at least part of the connecting area and including a contact area (e.g., the contact area 3331 of FIG. 5C) to which a conductor electrically coupled with a ground portion of the display device is exposed, and a shielding member (e.g., the shielding member 335 of FIG. 5C) electrically coupled with the contact area. The shielding member may be disposed on the FPCB and one face of the connecting area to cover at least part of the display driving circuit.

According to various embodiments, the connecting area may be disposed to overlap with at least part of the substrate layer below the substrate layer in a state of being bent by a bendable portion (e.g., the bendable portion 3321 of FIG. 5C) constructed in at least part of the connecting area.

According to various embodiments, the shielding member may be constructed to have a size extending to the bendable portion from the contact area.

According to various embodiments, the electronic device may include at least one conductive contact (e.g., the conductive contact 3323 of FIG. 6A) disposed around the driving circuit of the connecting area. The conductive contact may be disposed to be exposed to an outer face of the connecting area so as to be coupled with the shielding member.

According to various embodiments, a display device (e.g., the display 330 of FIG. 5C) may include a display panel (e.g., the display panel 3302 of FIG. 5B) including at least one pixel, a substrate layer (e.g., the substrate layer 3301 of FIG. 5B) disposed below the display panel, a bendable connecting area (e.g., the connecting area (the area A2) of FIG. 5B) electrically coupled with the substrate layer, a display driving circuit (e.g., the driving circuit 3322 of FIG. 5C) disposed to one face of the connecting area, an FPCB (e.g., the FPCB 333 of FIG. 5C) including a contact area (e.g., the contact area 3331 of FIG. 5C) to which a conductor electrically coupled with a ground portion of the display device is exposed, and a shielding member (e.g., the shielding member 335 of FIG. 5C) electrically coupled with the contact area. The shielding member may be disposed on the FPCB and one face of the connecting area to cover at least part of the display driving circuit.

According to various embodiments, the connecting area may be disposed to overlap with at least part of the substrate layer below the substrate layer in a state of being bent by a bendable portion (e.g., the bendable portion 3321 of FIG. 5C) constructed in at least part of the connecting area.

According to various embodiments, the shielding member may be constructed to have a size extending to the bendable portion from the contact area.

According to various embodiments, the electronic device may include at least one conductive contact (e.g., the conductive contact 3323 of FIG. 6A) disposed around the driving circuit of the connecting area. The conductive contact may be disposed to be exposed to an outer face of the connecting area so as to be coupled with the shielding member.

Various embodiments of the present disclosure disclosed in the present specification and the drawing are merely a specific example presented for clarity and are not intended to limit the scope of the embodiments of the present disclosure. Therefore, in addition to the embodiments disclosed herein, various changes in forms and details made without departing from the technical concept of the various embodiments of the present disclosure will be construed as being included in the scope of the various embodiments of the present disclosure.

The invention claimed is:
1. An electronic device comprising:
a housing; and
a display disposed to at least part of the housing, wherein the display comprises:
a display panel comprising at least one pixel;
a substrate layer disposed below the display panel, wherein the substrate layer comprises a bendable connecting area extending to an outside of the display panel;
a display driving circuit disposed to one face of the bendable connecting area;
a Flexible Printed Circuit Board (FPCB) electrically coupled with at least part of the bendable connecting area through a first face of the FPCB and comprising a contact area to which a conductor electrically coupled with a ground portion of the electronic device is exposed, wherein the contact area is exposed on a second face of the FPCB opposite the first face of the FPCB; and
a shielding member physically contacting and electrically coupled with the contact area exposed on the second face of the FPCB,
wherein the shielding member is disposed on the second face of the FPCB and the one face of the bendable connecting area to cover at least part of the display driving circuit.

2. The electronic device of claim 1, comprising at least one conductive contact disposed around the display driving circuit of the bendable connecting area.

3. The electronic device of claim 2, wherein the conductive contact is disposed to be exposed to the one face of the bendable connecting area so as to be coupled with the shielding member.

4. The electronic device of claim 2, wherein the conductive contact is disposed to surround the display driving circuit together with the contact area.

5. The electronic device of claim 1, further comprising a conductive member disposed below the substrate layer, wherein the bendable connecting area is disposed to overlap with at least part of the conductive member below the substrate layer in a state of being bent by a bendable portion constructed in at least part of the bendable connecting area.

6. The electronic device of claim 5, further comprising:
at least one opening disposed around the display driving circuit of the bendable connecting area; and
a conductive material filled in the opening.

7. The electronic device of claim 6, wherein the opening is disposed to surround the display driving circuit together with the contact area.

8. The electronic device of claim 6, wherein the opening is disposed at a position overlapping with the shielding member in the bendable connecting area.

9. The electronic device of claim 8, wherein the shielding member is disposed to be physically in contact or electrically coupled with the conductive member by using the conductive material filled in the opening.

10. The electronic device of claim 5, further comprising at least one conductive via disposed around the display driving circuit of the bendable connecting area.

11. The electronic device of claim 10, wherein the conductive via is disposed to surround the display driving circuit together with the contact area.

12. The electronic device of claim 10, wherein the conductive via is disposed at a position overlapping with the shielding member in the bendable connecting area, and the shielding member is disposed to be physically in contact or electrically coupled with the conductive member by using the conductive via.

13. The electronic device of claim 1, wherein the bendable connecting area is disposed to overlap with at least part of a conductive member below the substrate layer in a state of being bent by a bendable portion constructed in at least part of the bendable connecting area.

14. The electronic device of claim 13, wherein the shielding member is constructed to have a size extending to the bendable portion from the contact area.

15. The electronic device of claim 1, wherein the shielding member comprises a conductive thin-film tape, conductive plate, or conductive paint attached to the bendable connecting area.

* * * * *